United States Patent
Ghetti et al.

(10) Patent No.: US 12,002,510 B2
(45) Date of Patent: Jun. 4, 2024

(54) PROGRAM CURRENT CONTROLLER AND SENSE CIRCUIT FOR CROSS-POINT MEMORY DEVICES

(71) Applicant: Micron Technology, Inc., Boise, ID (US)

(72) Inventors: Andrea Ghetti, Concorezzo (IT); Andrea Martinelli, Bergamo (IT); Efrem Bolandrina, Fiorano al Serio (IT); Ferdinando Bedeschi, Biassono (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 17/588,718

(22) Filed: Jan. 31, 2022

(65) Prior Publication Data

US 2023/0245701 A1 Aug. 3, 2023

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/003* (2013.01); *G11C 13/004* (2013.01); *G11C 13/0004* (2013.01); *G11C 2213/15* (2013.01); *G11C 2213/30* (2013.01)

(58) Field of Classification Search
CPC . G11C 13/0004; G11C 13/003; G11C 13/004; G11C 13/0069; G11C 2013/0045; G11C 2013/0073; G11C 2213/73; G11C 2013/0052; G11C 2013/0057; G11C 2013/005; G11C 2013/0047; G11C 2213/77; G11C 11/5678; G11C 13/0026; G11C 13/0028; G11C 2213/15; G11C 2213/30; G11C 2213/31; G11C 13/0009; G11C 13/0023; G11C 13/0033; G11C 13/0061; G11C 13/0064; G11C 2013/0088
USPC ................................................. 365/148, 163
See application file for complete search history.

(56) References Cited

U.S. PATENT DOCUMENTS 8,681,529 B2 * 3/2014 Liu ............... G11C 13/0069
365/148

* cited by examiner

*Primary Examiner* — Thong Q Le
(74) *Attorney, Agent, or Firm* — Greenberg Traurig

(57) ABSTRACT

Systems, methods, and apparatus related to memory devices. In one approach, a vertical three-dimensional cross-point memory device uses digit line decoders that include, on the digit line side of memory cells, a current limiter and sensing circuit configured to control program current in either of positive or negative program polarities, as selected by a controller. Two current limiters are each used on the digit line side of each memory cell. A negative polarity current limiter is used for pull-up, and a positive polarity current limiter is used for pull-down. A negative polarity sensing circuit is used between the respective digit line decoder and a positive supply voltage. A positive polarity sensing circuit is used between the respective digit line decoder and a negative supply voltage. The current limiter and sensing circuit pair of the same polarity is coupled to each digit line decoder based on the selected program polarity.

30 Claims, 8 Drawing Sheets

PROGRAM CURRENT CONTROLLER AND SENSE CIRCUIT FOR CROSS-POINT MEMORY DEVICES

FIELD OF THE TECHNOLOGY

At least some embodiments disclosed herein relate to memory devices in general, and more particularly, but not limited to configuring access line decoders in a memory device based on a selected program polarity.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory devices (e.g., FeRAM) may maintain their stored logic state for extended periods of time even in the absence of an external power source. Volatile memory devices (e.g., DRAM) may lose their stored state when disconnected from an external power source.

Memory devices include non-volatile storage devices such as, for example, NAND flash memory devices. NAND flash is a type of flash memory constructed using NAND logic gates. Alternatively, NOR flash is a type of flash memory constructed using NOR logic gates. Currently, the use of NAND flash predominates the flash market.

Typical storage devices have controllers that receive data access requests from host computers and perform programmed computing tasks to implement the requests in ways that may be specific to the media and structure configured in the storage devices. In one example, a flash memory controller manages data stored in flash memory and communicates with a host computing device. In some cases, flash memory controllers are used in solid-state drives (e.g., for use in mobile devices).

Firmware can be used to operate a flash memory controller for a particular storage device. In one example, when a host computer reads data from or writes data to a flash memory device, it communicates with the flash memory controller.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
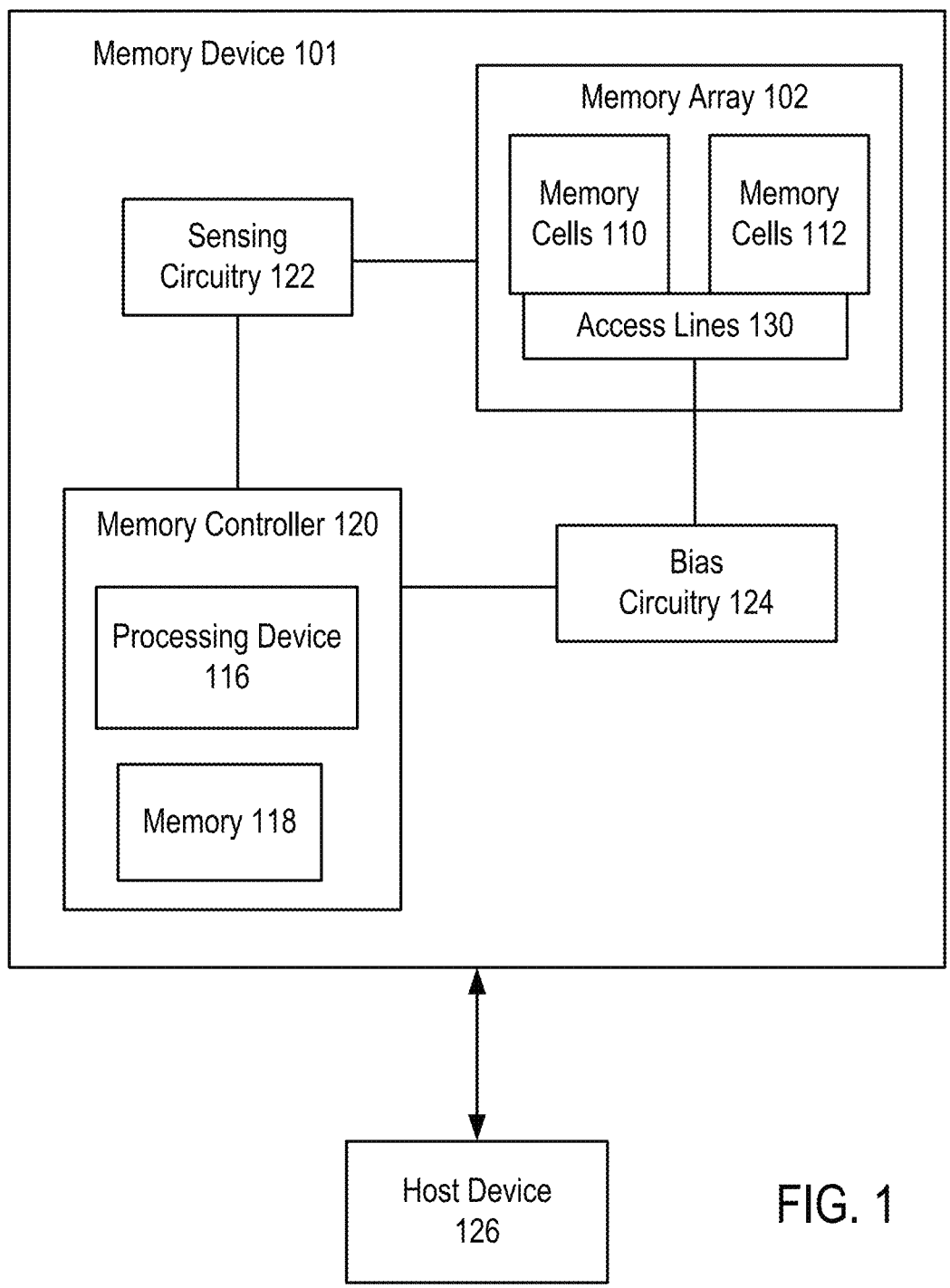
FIG. 1 shows a memory device that selects and senses memory cells in a memory array, in accordance with some embodiments.

The following disclosure describes various embodiments for a memory device that configures access line decoders based on a selected program polarity. Access lines in a memory device include wordlines and digit lines. It should be noted that a "digit line" is also known as and sometimes referred to herein as a "bit line". In one embodiment, the configured access line decoder is a digit line decoder.

At least some embodiments herein relate to non-volatile memory devices that implement a memory array using a cross-point architecture (e.g., vertical three-dimensional cross-point memory). The memory device may, for example, store data used by a host device (e.g., a computing device of an autonomous vehicle, a processor in a mobile device, or a computing device of a control system for various industrial or consumer equipment). In one example, the memory device is a solid-state drive mounted in an electric vehicle.

Some cross-point memory devices use memory cells that require a high voltage be applied to select a particular memory cell in the memory array. For example, a memory cell using chalcogenide as a storage element requires a high voltage across its two electrodes in order to snap the cell, which changes the memory cell from an off state to an on state. However, when the cell snaps, a high current can flow through the cell. This can damage the cell and/or degrade its reliability.

To avoid such high current, a current limiter is used in the circuit path for the access line used to select the cell. The current limiter limits current during a program operation that is caused by the memory cell snapping (also sometimes referred to as a snap-back of the memory cell). This current must be controlled in both negative and positive program polarities for dual polarity memory devices. For example, for chalcogenide memory cells in a cross-point memory array, the cell current needs to be controlled after switching, regardless of cell position and program polarity, as the cell properties depend on the program current.

Some existing memory devices (e.g., a planar memory device) use a single current limiter to limit current for either negative or positive program polarities. This current limiter is shared by and coupled to both the wordline and digit line decoders used to select a given cell. The cell is also coupled to sense circuitry (e.g., the same current limiter and sense circuit is shared between wordline (WL) and digit line (DL) decoders). The current limiter can be shared because the wordline and digit line have comparable parasitic resistance and capacitance.

However, due to different structural characteristics, in vertical three-dimensional cross-point memory devices the wordline has a significantly higher capacitance as compared to the digit line. For example, this higher wordline capacitance is due to the structural aspects of three-dimensional layers used to form the memory array. In contrast, the digit line is of relatively much shorter length, and thus has much lower capacitance.

The above asymmetry in capacitive load is such that the wordline capacitance (e.g., formed by combs with many long fingers) can be orders of magnitude higher (e.g., 100× or more) than the digit line capacitance (e.g., formed as a single short pillar). This prevents the use of the same current limiter and sense circuitry for both program polarities.

Various embodiments of the present disclosure provide a technological solution to the above technical problems by using an architecture for an access line (e.g., digit line) decoder that includes, on the same side of the memory cell, a current limiter and sensing circuit able to control program current in either of dual program polarities. In one embodiment, two current limiters are each used on the digit line side of the memory cell. One current limiter (for negative program polarity) is used for pull-up, and the other current limiter (for positive program polarity) is used for pull-down. A negative polarity sensing circuit is used between the negative polarity current limiter and a positive supply voltage (e.g., Vpp). A positive polarity sensing circuit is used between the positive polarity current limiter and a negative supply voltage (e.g., Vnn). In contrast to the digit line side, no sensing circuit or current limiter is used on the wordline side of the memory cell.

In one embodiment, a memory device (e.g., vertical three-dimensional cross-point memory) includes a wordline decoder configured to select a wordline for accessing a memory cell in a memory array. A digit line decoder is configured to select a digit line for accessing the memory cell.

A controller is configured to select operation in a first program polarity (e.g., negative (NEG) polarity sense) or a second program polarity (e.g., positive (POS) polarity sense). The first and second program polarities are opposite (e.g., the memory device is a dual polarity device).

First circuitry (e.g., NEG polarity (POL) sense amplifier (SA)) is coupled between a first voltage supply (e.g., Vpp) and the digit line decoder. The first circuitry is configured to sense a characteristic (e.g., current) associated with the memory cell, and limit a current (e.g., $I_{cell}$) through the memory cell when operating in the first program polarity.

Second circuitry (e.g., POS POL SA) is coupled between a second voltage supply (e.g., Vnn) and the digit line decoder. The second circuitry is configured to sense the characteristic associated with the memory cell, and limit the current through the memory cell when operating in the second program polarity. The first and second voltage supplies are of opposite polarity.

Various advantages are provided by embodiments described herein. In one advantage, time wasted waiting for wordline discharge is avoided. For example, sensing the cell from the wordline side is problematic due to the large capacitance described above. When the cell snaps, the wordline transient is not yet over, and a large current is drawn from the wordline decoder. This wordline charging current in effect hides the cell current that is the signal needing to be read by the sensing circuit. This causes wasted time waiting for the wordline transient to end so that only the actual steady-state cell current is read. However, when using sensing and current control on the digit line side as described herein, the digit line current substantially immediately follows the cell current so that wasted time is avoided.

FIG. 1 shows a memory device 101 that applies program or write voltages to memory cells 110, 112 in a memory array 102 when performing program or write operations, in accordance with some embodiments. An example of memory device 101 is a vertical three-dimensional cross-point memory.

Memory device 101 includes memory controller 120, which controls sensing circuitry 122 and bias circuitry 124. Memory controller 120 includes processing device 116 and memory 118. In one example, memory 118 stores firmware that executes on processing device 116 to perform various operations for memory device 101. In one example, the operations include reading and writing to memory cells 110, 112 of memory array 102. In one example, memory cells 110 are located in a left half tile and memory cells 112 are located in a right half tile of the memory array.

Access lines 130 of memory array 102 are used to access memory cells 110, 112. In one example, access lines 130 are wordlines and/or bit lines (also known as digit lines).

Bias circuitry 124 is used to generate voltages on access lines 130. In one example, vias are used to electrically connect access lines 130 to bias circuitry 124. In one example, a via is used to electrically connect each access line 130 to a word or bit line driver of bias circuitry 124.

In one example, a voltage is generated on access line 130 to access a memory cell 110. In one example, the voltage is driven as part of a read or write operation performed in response to a command received from host device 126.

Sensing circuitry 122 is used to sense current flowing through memory cells 110, 112. In one example, sensing circuitry 122 senses a current that results from applying a voltage to a memory cell 110 during a read operation.

Figure 5:
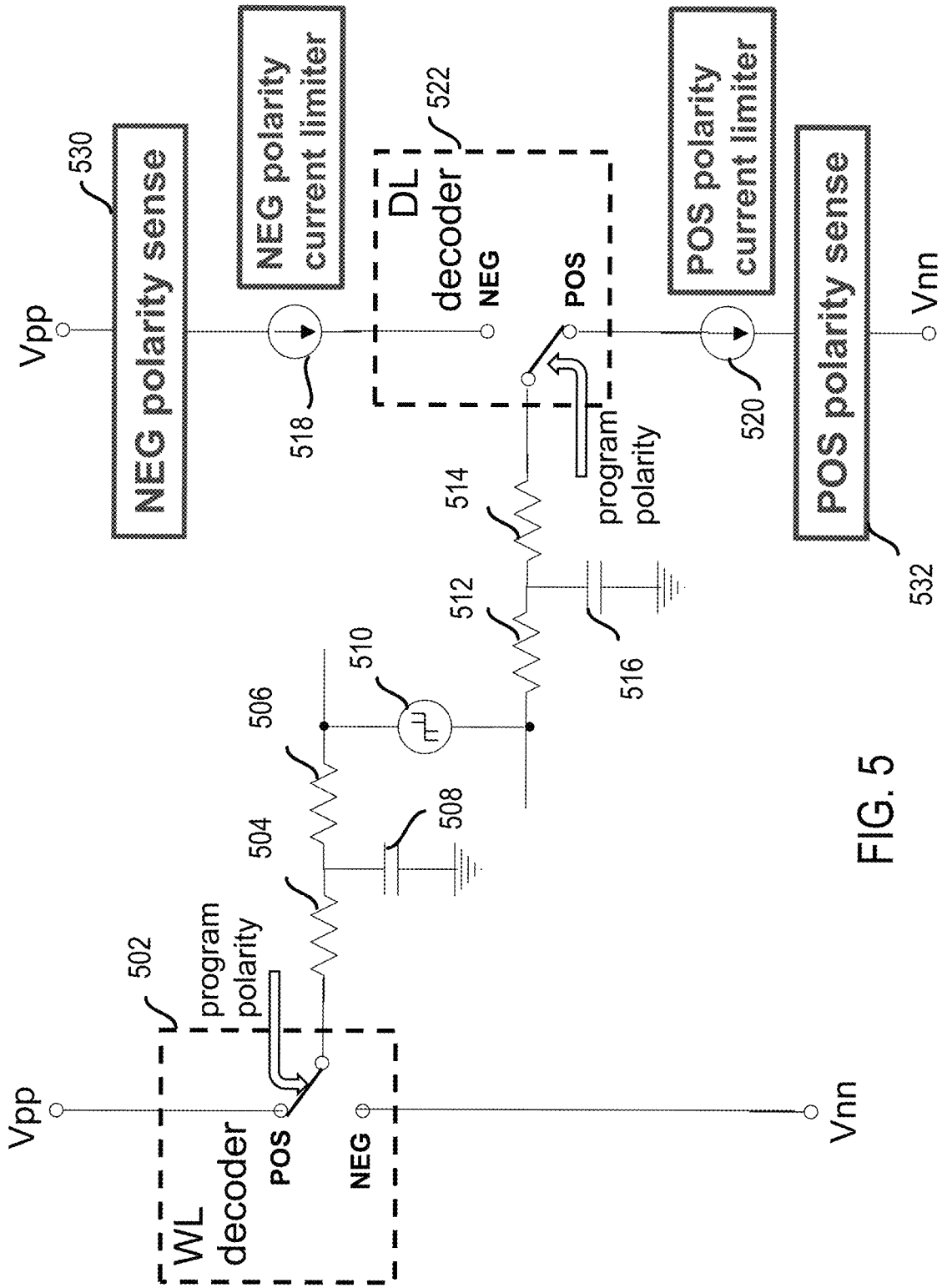
FIG. 5 shows a memory device having an access line decoder that selects a memory cell and is configured based on a selected program polarity, in accordance with some embodiments.

In one example, sensing circuitry 122 includes negative and positive sensing circuits on the digit line side of a memory array by being selectively coupled to digit line decoders (see, e.g., FIG. 5). In one example, bias circuitry 124 includes positive and negative supply voltages that are applied to memory cells through digit line decoders.

In one embodiment, memory device 101 selects write voltages for applying to memory cells 110, 112 when performing write operations. In one embodiment, the write voltage is controlled by memory controller 120 (e.g., controlled based on an output from a machine learning model).

In one embodiment, bias circuitry 124 is implemented by one or more voltage drivers. Bias circuitry 124 may be used to generate read voltages for read operations performed on memory array 102 (e.g., in response to a read command from host device 126).

In one embodiment, sensing circuitry 122 is used to sense a state of each memory cell in memory array 102. In one example, sensing circuitry 122 includes current sensors (e.g., implemented using positive and negative polarity sense amplifiers) used to detect a current caused by applying various read voltages to memory cells in memory array 102. Sensing circuitry 122 senses a current associated with each of the memory cells 110 caused by applying the voltage.

In one example, if sensing circuitry 122 determines that the respective current resulting from applying a read voltage to the memory cell is greater than a respective fixed threshold (e.g., a predetermined level of current or threshold current), then memory controller 120 determines that the memory cell has snapped.

In one embodiment, memory cells 110, 112 can be of different memory types (e.g., PCM, RRAM, etc.).

In one embodiment, memory controller 120 receives a write command from host device 126. The write command is accompanied by data (e.g., user data of a user of host device 126) to be written to memory array 102. In response to receiving the write command, controller 120 initiates a programming operation by applying voltages to memory cells 110.

In one embodiment, controller 120 determines respective currents resulting from applying the voltages. In one embodiment, controller 120 provides timing signals to switches, which are used to cause various circuitry to control the currents for memory cells. In one example, local data sensing and/or processing circuitry is used to determine cell current and/or data logic for individual memory cells.

In one embodiment, controller 120 determines whether the existing programming state (e.g., logic state zero) and the target programming state (e.g., logic state zero) for each cell are equal. If the existing and target programming states are equal, then no write voltage is applied (e.g., this is a normal write mode). If the existing and target programming states are different, then a write voltage is applied to that particular memory cell. In one example, the write voltage is 3-8 volts applied across the memory cell by applying voltage biases to the wordline and bit line used to select the cell.

In one example, controller 120 may use write voltages (e.g., write pulses) to write a logic state to a memory cell, such as memory cell 110, 112 during the write operation. The write pulses may be applied by providing a first voltage (e.g., a positive voltage) to a bit line and providing a second voltage (e.g., a negative voltage) to a wordline to select the memory cell. Circuits electrically connected to access lines to which memory cells may be electrically connected can be used to provide the write voltages (e.g., access line drivers included in digit line or bit line decoder circuits). The circuits may be controlled by internal control signals provided by a control logic (e.g., controller 120). The resulting voltage applied to the memory cell is the difference between the first and second voltages.

In one embodiment, the memory cell has one or more physical properties that are changed to correspond to different logic states. In one example, the changed physical property relates to atomic structure. In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

In one example, a wordline is discharged when selecting a memory cell. Bias circuitry 124 discharges the wordline to a negative voltage. The wordline is discharged to a final negative voltage sufficient for programming the memory cell (e.g., −3V). The digit line or bit line is charged to a positive voltage (e.g., +3V).

Figure 2:
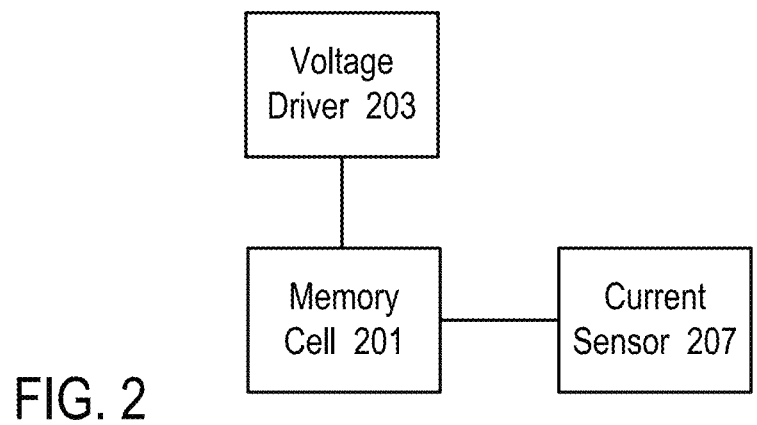
FIG. 2 shows a voltage driver that drives a voltage profile applied to a memory cell, in accordance with some embodiments.

FIG. 2 shows a voltage driver 203 that drives a voltage applied to a memory cell 201, in accordance with some embodiments. Voltage driver 203 is configured to drive up or down the voltage applied on an access line to select the memory cell 201 during a read or write operation. In one embodiment, voltage driver 203 is implemented by multiple voltage drivers. In one example, a portion of the voltage drivers are bit line drivers, and another portion of the voltage drivers are wordline drivers. In one example, voltage drivers 203 are included in bias circuitry 124. Memory cell 201 is an example of memory cell 110, 112.

In one example, when a sensing voltage is applied to memory cell 201, current sensor 207 determines a current resulting from applying the sensing voltage. In one example, voltage drivers 203 apply the sensing voltage by driving a bit line to a positive voltage, and a wordline to a negative voltage.

Current sensor 207 is an example of sensing circuitry 122. In one example, current sensor 207 is a negative or positive polarity sense amplifier.

In one example, after applying the voltage, when the voltage applied on the memory cell 201 is above the threshold voltage of a programmed cell, the current sensor 207 is configured to determine whether or not the memory cell 201 is conductive, based on the current going through the memory cell 201. If the current sensor 207 detects an amount of current corresponding to a programmed cell, the memory cell 201 is determined to have been programmed to be a SET cell to have a low voltage threshold (corresponding to data that is different from the data represented by a RESET cell that has a high voltage threshold). If the current sensor 207 does not detect the amount of current corresponding to a programmed cell, the memory cell is determined to be a reset cell that corresponds to predetermined data represented by having high voltage thresholds (e.g., cells that have not yet been programmed after a reset or erase operation, or cells that have been programmed to have a high voltage threshold).

Figure 3:
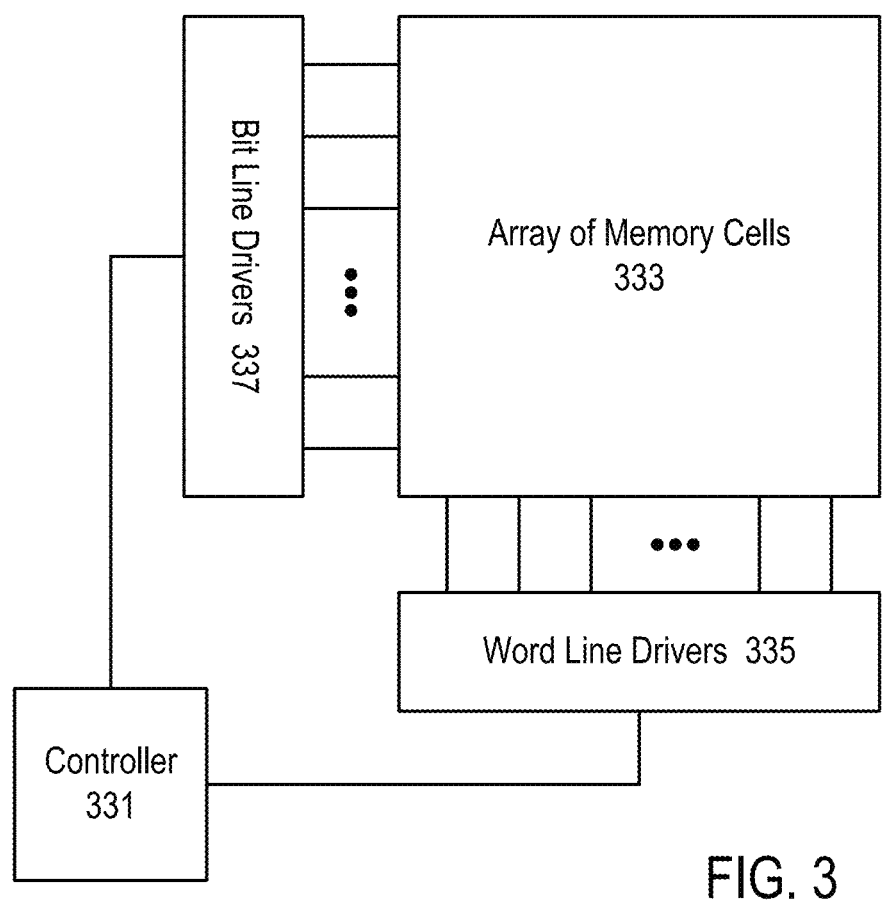
FIG. 3 shows a memory device configured with drivers to drive voltages on access lines to select memory cells in a memory array, in accordance with some embodiments.

FIG. 3 shows a memory device configured with drivers 335, 337 to drive voltages on access lines to select memory cells in a memory array 333, in accordance with some embodiments. For example, memory cell 201 illustrated in FIG. 2 can be used in the memory array 333.

The memory device of FIG. 3 includes a controller 331 that operates bit line drivers 337 and wordline drivers 335 to access the individual memory cells (e.g., cell 201) in the memory array 333. Controller 331 is an example of memory controller 120. Memory array 333 is an example of memory array 102.

The bit line drivers 337 and/or the wordline drivers 335 can be implemented by voltage drivers 203 as illustrated in FIG. 2. In one example, each memory cell (e.g., 201) in the array 333 can be accessed via voltages driven by a pair of a bit line driver and a wordline driver, as illustrated in FIG. 4.

In one example, bit line drivers 337 include bit line or digit line decoders to select memory cells in memory array 333. Each digit line decoder can be coupled to either a positive or negative polarity sensing circuit and current limiter (see, e.g., FIG. 5), depending on a program polarity being used during a program operation for the selected memory cells. Wordline drivers 335 include wordline decoders to select memory cells in memory array 333.

Figure 4:
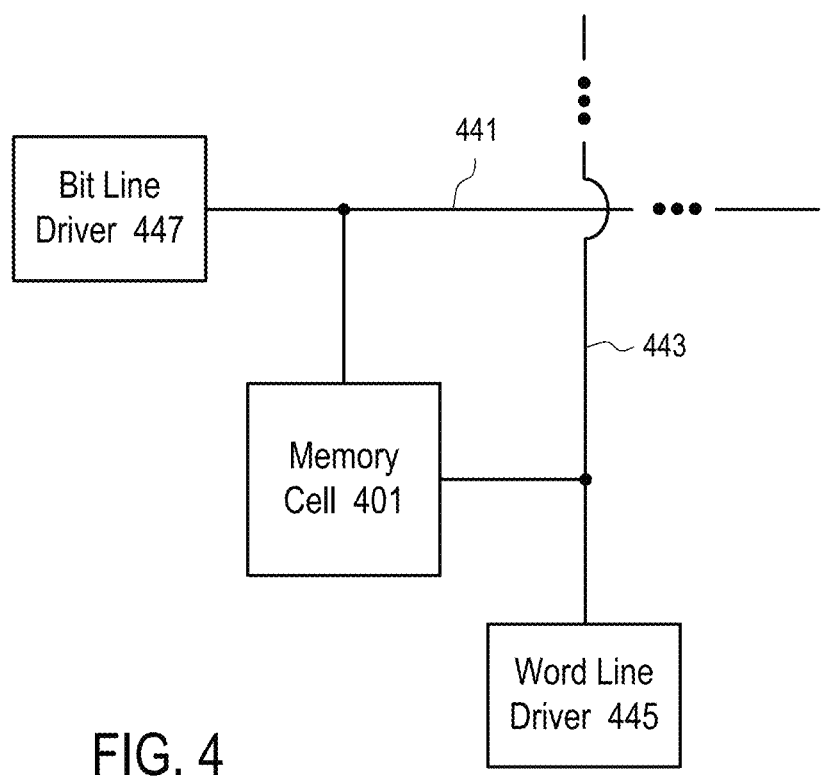
FIG. 4 shows a memory cell with a bit line driver and a wordline driver configured to generate voltages on access lines, in accordance with some embodiments.

FIG. 4 shows a memory cell 401 with a bit line driver 447 and a wordline driver 445 configured to generate voltages on access lines 441, 443, in accordance with some embodiments. For example, bit line driver 447 drives a first voltage applied to a row of memory cells in the array 333; and wordline driver 445 drives a second voltage applied to a column of memory cells in the array 333. A memory cell 401 in the row and column of the memory cell array 333 is subjected to the voltage difference between the first voltage driven by the word line driver 447 and the second voltage driven by the bit line driver 445. When the first voltage is higher than the second voltage, the memory cell 401 is subjected to one voltage polarity (e.g., positive polarity); and when the first voltage is lower than the second voltage, the memory cell 401 is subjected to an opposite voltage polarity (e.g., negative polarity).

For example, when the memory cell 401 is configured to be read with positive voltage polarity, the bit line driver 447 can be configured to drive a positive voltage. For example, when the memory cell 401 is configured to be read with negative voltage polarity, the wordline driver 445 can be configured to drive a positive voltage.

For example, during a write operation, both the bit line driver 447 and the wordline driver 445 can drive voltages of differing magnitudes (e.g., to perform read and write steps). For example, the bit line driver 447 can be configured to drive a positive voltage with differing magnitudes; and the wordline driver 445 can be configured to drive a negative voltage with differing magnitudes. The difference between the voltage driven by the bit line driver 447 and the voltage driven the wordline driver 445 corresponds to the voltage applied on the memory cell 401.

In one example, bit line drivers 337 can be used to drive access lines (e.g., parallel wires) (e.g., 441) arranged in one direction and disposed in one layer of cross-point memory; and the wordline drivers 435 can be used to drive access lines (e.g., parallel wires) (e.g., 443) arranged in another direction and disposed in another layer of the cross-point memory. For example, the wires (e.g., 441) connected to the bit line drivers (e.g., 447) and the wires (e.g., 443) connected to the wordline drivers (e.g., 445) run in orthogonal directions. The memory cell array 333 is sandwiched between the two wires; and a memory cell (e.g., 401) in the array 333 is formed at a cross point of the two wires (e.g., 441 and 443) in the integrated circuit die of the cross-point memory.

FIG. 5 shows a memory device having an access line decoder (e.g., digit line decoder 522) that selects a memory cell 510 and is configured during operation of the memory device based on a selected program polarity (e.g., positive or negative as determined by a controller (not shown)), in accordance with some embodiments. Memory cell 510 is an example of memory cells 110, 112, 201, 401.

Wordline decoder 502 and digit line decoder 522 are used together to select memory cell 510 (e.g., for a program operation). Wordline decoder 502 and digit line decoder 522 are each coupled to a positive or negative supply voltage depending on the program polarity, as illustrated.

Capacitance 508 is a parasitic capacitance associated with the structure of the word line selected by wordline decoder 502. Capacitance 516 is a parasitic capacitance associated with the structure of the digit line selected by digit line decoder 522. The wordline capacitance 508 can be significantly higher than the digit line capacitance 516. In various examples, this capacitance ratio (capacitance 508 to capacitance 516 ratio) can be 100:1 or even 1,000:1. These high ratios are exhibited, for example, in a vertical three-dimensional cross-point memory.

Parasitic resistances 504, 506 are associated with the wordline. Parasitic resistances 512, 514 are associated with the digit line.

A negative polarity sensing circuit 530 and current limiter 518 are coupled between positive supply voltage Vpp and digit line decoder 522 (on the digit line side of memory cell 510), and are used during a program operation for a negative program polarity. A positive polarity sensing circuit 532 and current limiter 520 are coupled between negative supply voltage Vnn and digit line decoder 522 (on the digit line side of memory cell 510), and are used during a program operation for a positive program polarity.

The sensing circuits and current limiters can be of similar construction or topology, but configured for the respective polarity (e.g., using NMOS or PMOS devices). In one embodiment, the topology can be different for each polarity to correspond to different memory cell behavior for each respective polarity.

It should be noted that in an alternative embodiment, if the digit line parasitic capacitance is significantly greater than the wordline parasitic capacitance, then the above dual polarity sensing circuit/current limiter approach can similarly be implemented on the wordline side instead of the digit line side.

Figure 6:
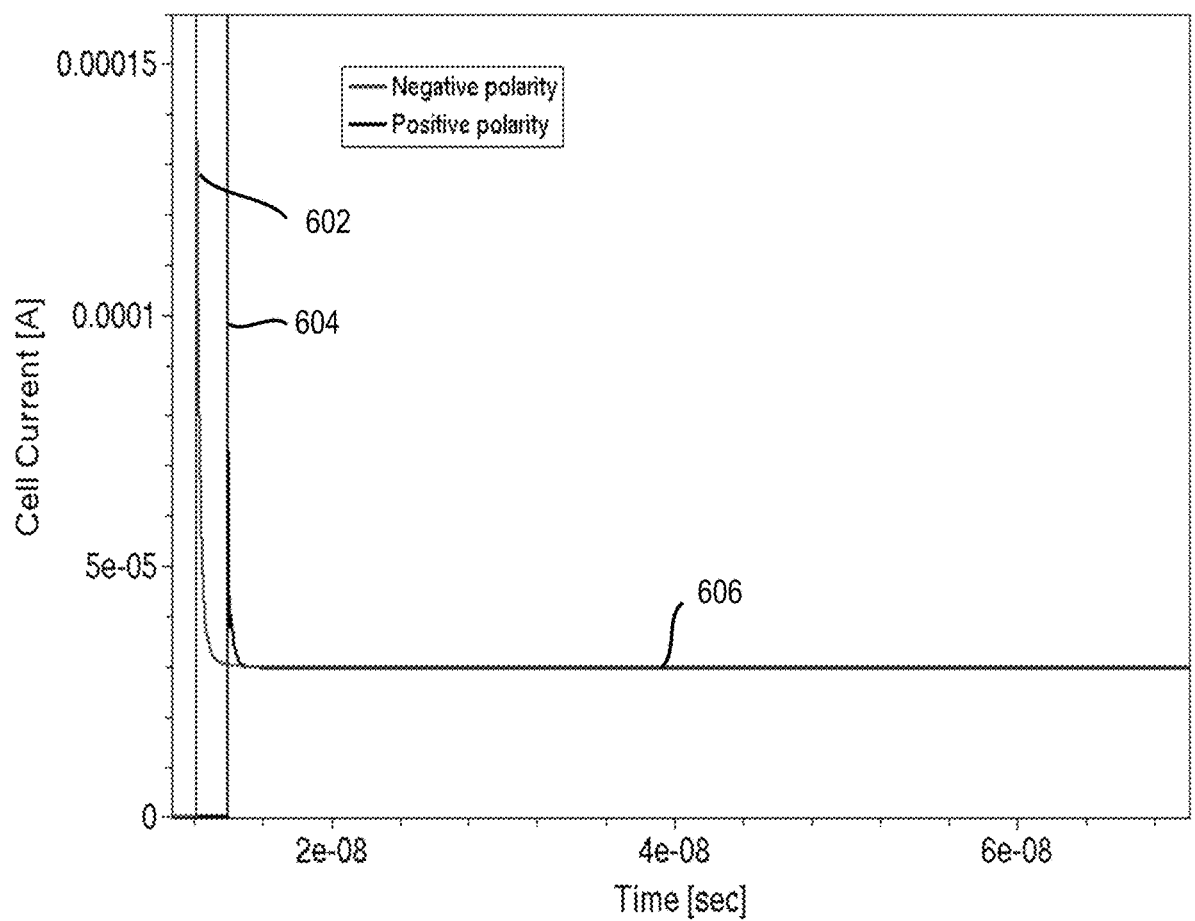
FIG. 6 shows an exemplary graph of cell current vs. time for the memory cell of FIG. 5.

FIG. 6 shows an exemplary graph of cell current (amps) vs. time for the memory cell 510 of FIG. 5. Current graph 602 corresponds to a negative program polarity, and current graph 604 corresponds to a positive program polarity. The negative and positive polarity current limiters above are used to control the current to a desired program current level 606. The current is desirably sensed when the cell current has settled to current level 606. It is desired that the current settle in a very short time.

Figure 7:
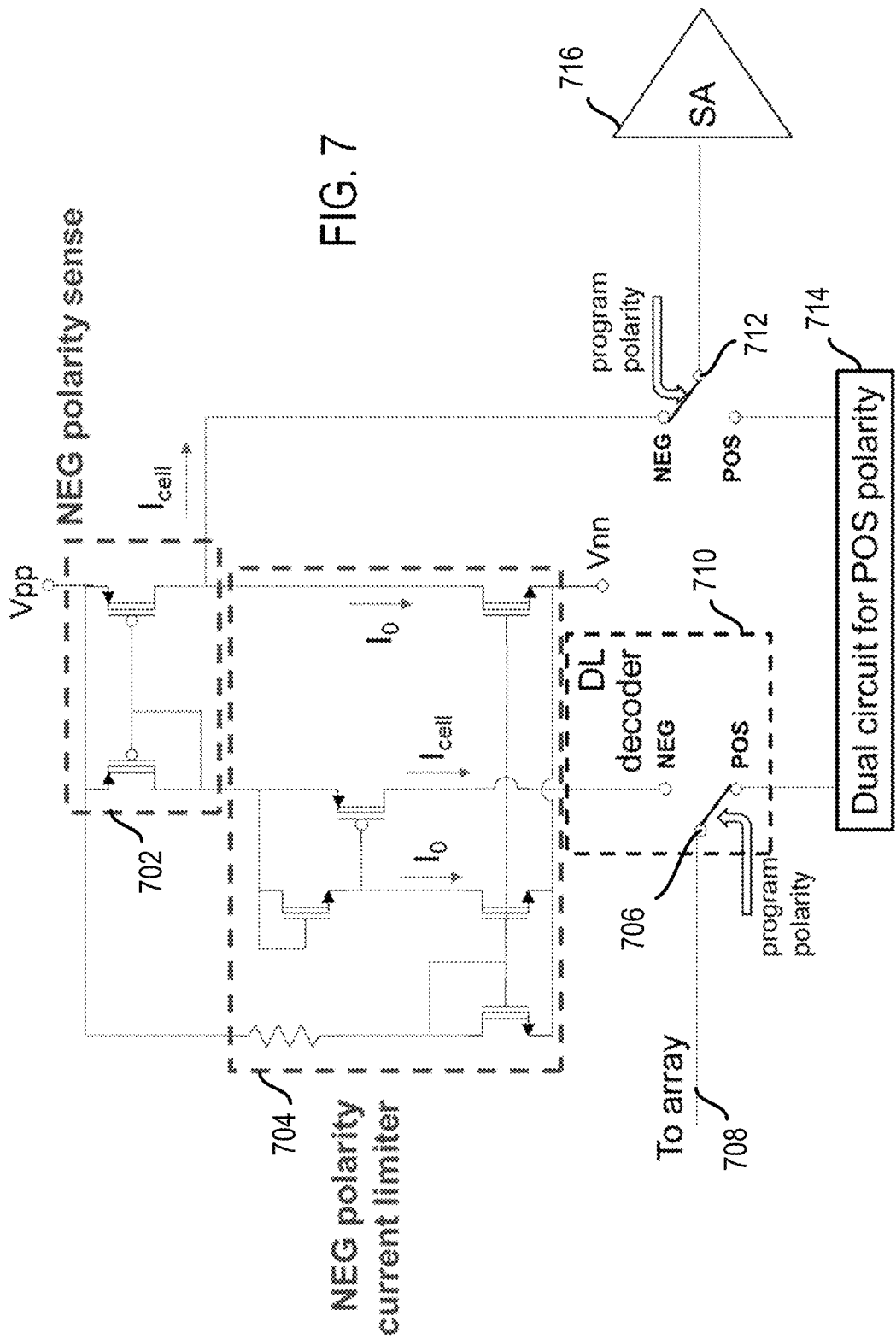
FIG. 7 shows negative and positive polarity sensing circuits and current limiters coupled to a digit line decoder based on a program polarity, in accordance with some embodiments.

FIG. 7 shows negative and positive polarity sensing circuits and current limiters coupled to a digit line decoder 710 based on a program polarity, in accordance with some embodiments. Specifically, negative polarity sensing circuit 702 and current limiter 704 are coupled to digit line decoder 710 for a negative program polarity as selected by switch 706. Switch 706 is controlled by a controller (e.g., controller 120).

The output 708 of digit line decoder 710 couples to a memory array including a selected memory cell (e.g., memory cell 510). In one example, the memory array is array 102, 333.

Variations in the current limiter and/or sensing circuit can be used in various embodiments as may be desired for a particular memory device. Dual circuit 714 can have a similar structure as for the negative polarity circuits above, and includes a sensing circuit and current limiter for operation in the positive program polarity.

The memory cell current ($I_{cell}$) is sensed using sense amplifier (SA) 716. Sense amplifier 716 is configured for positive or negative polarity operation by a controller (e.g., controller 120) using switch 712.

Figure 8:
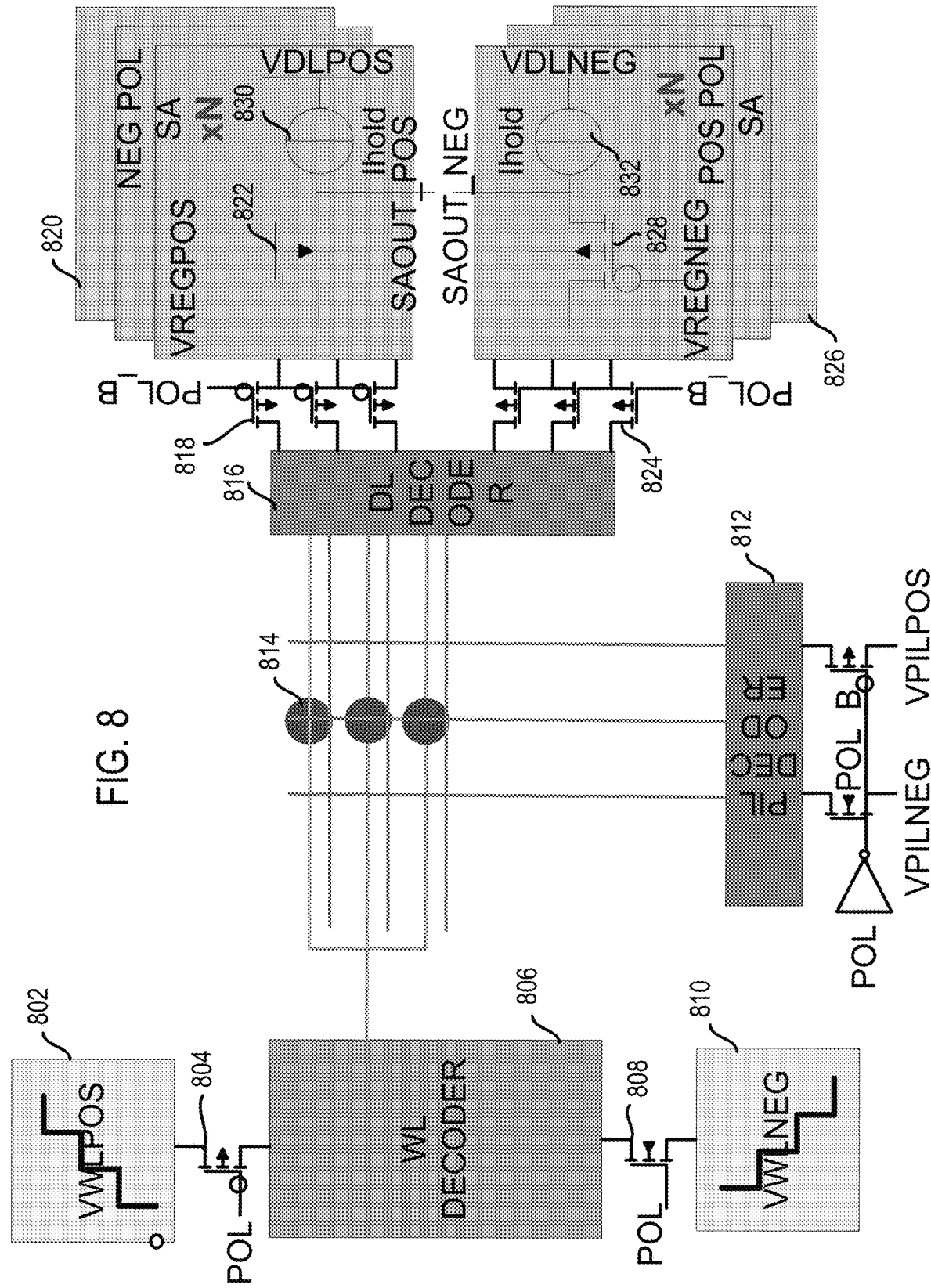
FIG. 8 shows a memory device having multiple digit line decoders coupled to negative or positive polarity sensing circuits and current limiters based on program polarity, in accordance with some embodiments.

FIG. 8 shows a memory device having multiple digit line decoders 816 coupled to negative or positive polarity sensing circuits 820, 826 and current limiters 830, 832 based on program polarity, in accordance with some embodiments. Wordline decoder 806 and a digit line decoder 816 are used to select a memory cell 814. In one embodiment, several digit line decoders 816 are used in parallel so that memory cells 814 located along a selected wordline can be programmed in parallel.

Wordline decoder 806 couples a positive or negative supply voltage 802, 810 to memory cell 814 as controlled by polarity signal POL. CMOS devices 804, 808 connect the supply voltage as configured by the polarity signal POL.

Each digit line decoder 816 is coupled to either a negative polarity sense amplifier 820 using PMOS devices 818, or to a positive polarity sense amplifier 826 using NMOS devices 824 as controlled by signal POL_B, which is the inverse of polarity signal POL. In other embodiments, signal POL_B can be controlled and generated independently of signal POL, as may be desired for a particular memory device.

Negative polarity sense amplifier 820 provides an output SAOUT_POS used to read memory cell 814. Positive polarity sense amplifier 826 provides an output SAOUT_NEG used to read memory cell 814. These outputs can, for example, be compared to various thresholds corresponding to different programming states of memory cell 814 to determine a logic state of the memory cell.

Negative polarity sense amplifier 820 includes current limiter 830, which limits cell current to a current level Ihold (e.g., current level 606). Positive polarity sense amplifier 826 includes current limiter 832, which limits cell current to a current level Ihold (e.g., current level 606). In alternative embodiments, the positive and negative current levels to which cell current is controlled can be different.

Negative polarity sense amplifier 820 is coupled to positive supply voltage VDLPOS, and uses circuit 822 (e.g., a CMOS voltage regulator) to regulate a voltage applied to memory cell(s) 814. Positive polarity sense amplifier 826 is coupled to negative supply voltage VDLNEG, and uses circuit 828 (e.g., a CMOS voltage regulator) to regulate a voltage applied to memory cell(s) 814.

It should be noted that for simplicity of illustration, the embodiments above are generally described as being planar two-dimensional devices. In one example, planar memory array (see, e.g., FIG. 3) uses two decoders. However, the embodiments herein are not limited to two-dimensional devices. In various embodiments, three-dimensional memory arrays can be used. In one example, a three-dimensional (3D) array uses three decoders: wordline, bit line, and pillar line decoders. The array includes pillars in the vertical direction. The pillar line decoder decodes the memory cell position in the third dimension.

In one embodiment, a pillar (PIL) line decoder 812 is used. PIL decoder 812 is coupled to pillar (PIL) lines that run orthogonally to the digit lines that select memory cells 814. PIL decoder 812 is used to provide another level of decoding so that each digit line connects to only one memory cell 814. A selection transistor coupled to PIL decoder 812 is located underneath each memory cell 814 (not shown).

In one example, in a three-dimensional memory array, pillar decoder 812 and digit line decoder 816 decode the cell position on a horizontal plane (select a pillar), while the wordline decoder 806 selects the cell along the pillar in the vertical direction.

The polarity signal POL is used to select a supply voltage VPILNEG or VPILPOS for PIL decoder 812. In one example, this voltage is sufficiently high to allow the voltage on the digit line to be effectively applied to the memory cell 814. In one example, the magnitude of this voltage is about half of the positive or negative supply voltage 802, 810.

In one embodiment, several current sense and limiter circuits allow operation in parallel on multiple N bits (×N). These circuits are configured in a memory device that uses CMOS working at a maximum cell voltage divided by half (Vcellmax/2) for each of PMOS devices for positive circuit paths, and NMOS devices for negative circuit paths. The wordline decoder and PIL/digit line decoders are configured to operate in opposite polarities. Each sense amplifier is configured to support read/write (R/W) voltages in both positive and negative polarities, to regulate a selection voltage (VREGPOS/NEG), and to limit the cell current after snapping (limit to Ihold).

In various embodiments, the various dual polarity sense amplifier/current limiter embodiments described above can be used for memory devices in which there is a substantial asymmetry between the two array lines used to select a memory cell. In one example, the asymmetry is exhibited by a memory device that programs more than one cell in parallel along the same wordline (or alternatively digit line). In this case the current limiter and the sense operation are performed in parallel only on the digit line (or alternatively wordline) side. In one example, the asymmetry is due to capacitance mismatch between the two array lines (e.g., a capacitance of the wordline is at least 100 times greater than a capacitance of the digit line).

Figure 9:
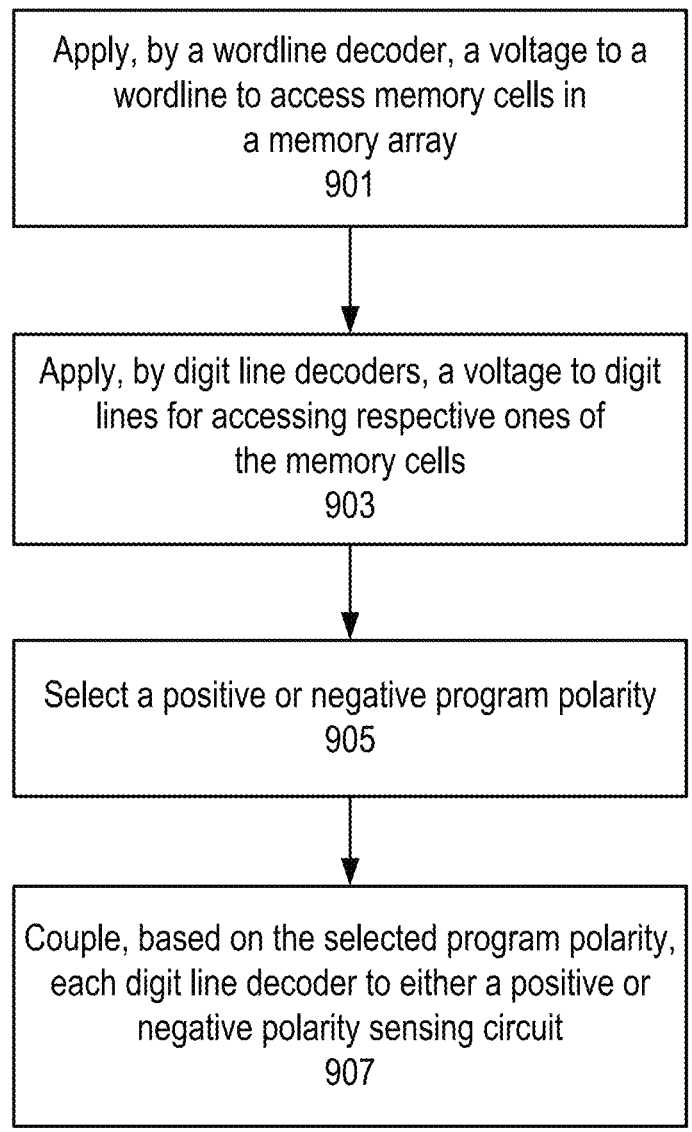
FIG. 9 shows a method for coupling digit line decoders to positive or negative polarity sensing circuits based on a selected program polarity, in accordance with some embodiments.

FIG. 9 shows a method for coupling digit line decoders to positive or negative polarity sensing circuits based on a selected program polarity, in accordance with some embodiments. For example, the method of FIG. 9 can be implemented in the system of FIG. 1, 5, 7, or 8. In one example, the positive or negative polarity sensing circuits are negative or positive sense amplifiers 820, 826, which are selectively coupled to digit line decoders 816 depending on program polarity.

The method of FIG. 9 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 9 is performed at least in part by one or more processing devices (e.g., processing device 116 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 901, a voltage is applied, by a wordline decoder, to a wordline to access memory cells in a memory array. In one example, the wordline decoder is decoder 502, 806.

At block 903, a voltage is applied, by digit line decoders, to digit lines for accessing respective ones of the memory cells. In one example, the digit line decoders are decoder 522, 710, 816.

At block 905, a positive or negative program polarity is selected. In one example, the polarity is polarity signal POL of FIG. 8, as generated and/or controlled by controller 120.

At block 907, each digit line decoder is coupled, based on the selected program polarity, to either a positive or negative polarity sensing circuit (e.g., 820, 826). In one example, the positive or negative polarity sensing circuits are circuits 530, 532.

In one embodiment, a device (e.g., memory device 101) comprises: a wordline decoder configured to select a wordline for accessing a memory cell (e.g., 510) in a memory array; a digit line decoder (e.g., 522) configured to select a digit line for accessing the memory cell; a controller configured to select operation in a first program polarity (e.g., NEG polarity sense of FIG. 5) or a second program polarity (e.g., POS), wherein the first and second program polarities are opposite; first circuitry (e.g., NEG POL SA 820 of FIG. 8) coupled between a first voltage supply (e.g., Vpp of FIG. 5, VDLPOS of FIG. 8) and the digit line decoder, the first circuitry configured to sense a characteristic associated with the memory cell, and limit a current through the memory cell when operating in the first program polarity; and second circuitry (e.g., POS POL SA 826 of FIG. 8) coupled between a second voltage supply (e.g., Vnn of FIG. 5, VDLNEG of FIG. 8) and the digit line decoder, the second circuitry configured to sense the characteristic associated with the memory cell, and limit the current through the memory cell when operating in the second program polarity, wherein the first and second voltage supplies are of opposite polarity.

In one embodiment, the characteristic is the current through the memory cell (e.g., $I_{cell}$ of FIG. 7). The first circuitry comprises a current limiter (e.g., 704) to limit the current, and a sense amplifier (e.g., 702, 716) to sense the current. The second circuitry comprises a current limiter to limit the current, and a sense amplifier to sense the current.

In one embodiment, the current passes through the first circuitry (e.g., NEG polarity current limiter 704 of FIG. 7) when operating in the first program polarity, and the current passes through the second circuitry when operating in the second program polarity.

In one embodiment, the first voltage supply (e.g., Vpp of FIG. 5) has a first polarity (e.g., positive); the second voltage supply (e.g., Vnn of FIG. 5) has a second polarity (e.g., negative); the wordline decoder is further configured to apply a voltage of the second polarity (e.g., negative) to the wordline when operating in the first program polarity (e.g., NEG program polarity); and the wordline decoder is further configured to apply a voltage of the first polarity (e.g., positive) to the wordline when operating in the second program polarity (e.g., POS program polarity).

In one embodiment, a capacitance of the wordline is at least 100 times greater than a capacitance of the digit line.

In one embodiment, the digit line decoder is a first digit line decoder of a plurality of digit line decoders; the memory cell is a first memory cell of a plurality of memory cells; the wordline is further configured to simultaneously select the memory cells during a read operation; and each of the memory cells is selected by a respective one of the digit line decoders during the read operation.

In one embodiment, the memory cell comprises chalcogenide. However, in other embodiments, materials other than chalcogenide can be used to form the memory cell. In addition, the memory cell can be any cell type that features or exhibits a snap-back of the I-V curve that characterizes the memory cell.

In one embodiment, the memory cell snaps after being accessed during a read or write operation, and the current is limited by a current limiter after the memory cell snaps.

In one embodiment, the memory cell exhibits an S-shaped current-voltage (I-V) characteristic curve.

In one embodiment, an apparatus comprises: a memory array (e.g., 102, 333); a wordline decoder configured to apply a voltage to a wordline for accessing first memory cells in the memory array, wherein the wordline decoder is further configured to operate in a first program polarity (e.g., NEG POL of FIG. 8) or a second program polarity (e.g., POS POL of FIG. 8), and wherein the first and second program polarities are opposite; a plurality of digit line decoders, each digit line decoder configured to apply a voltage to a respective digit line for accessing a respective one of the first memory cells; and a plurality of switches configured to couple each digit line decoder to a respective first sensing circuit (e.g., NEG POL SA of FIG. 8) when operating in the first program polarity (e.g., NEG), or to a respective second sensing circuit (e.g., POS POL SA of FIG. 8) when operating in the second program polarity (e.g., POS).

The first sensing circuit is configured to couple a first supply voltage (e.g., VDLPOS of FIG. 8) to the respective digit line decoder. The first sensing circuit is further configured to sense a current associated with the respective first memory cell, and limit the current (e.g., Ihold). The second sensing circuit is configured to couple a second supply voltage (e.g., VDLNEG of FIG. 8) to the respective digit line decoder, wherein the first and second supply voltages are of opposite polarity. The second sensing circuit is further configured to sense the current associated with the respective first memory cell, and limit the current (e.g., Ihold).

In one embodiment, each of the first memory cells comprises chalcogenide.

In one embodiment, each of the first memory cells snaps after being accessed during a read or write operation, and the current is limited for each respective memory cell after the memory cell snaps.

In one embodiment, each of the first memory cells exhibits an S-shaped current-voltage (I-V) characteristic curve.

In one embodiment, the first sensing circuit is further configured to regulate the voltage applied to the respective digit line (e.g., signal VREGPOS of FIG. 8 regulates the voltage to the digit line decoder 816), and the second sensing circuit is further configured to regulate the voltage applied to the respective digit line (e.g., signal VREGNEG of FIG. 8 regulates the voltage to the digit line decoder 816).

In one embodiment, the current is sensed by the first or second sensing circuit as part of a read operation to determine a logic state of the respective first memory cell (e.g., current is sensed based on output voltage SAOUT_POS or SAOUT_NEG from sense amplifier SA of FIG. 7).

In one embodiment, the read operation is performed by a controller in response to receiving a read command from a host device.

In one embodiment, the current sensed by the first or second sensing circuit is a current through the respective first memory cell.

In one embodiment, a method comprises: applying, by a wordline decoder, a voltage to a wordline for accessing first memory cells in a memory array, wherein the wordline decoder is configured to operate in a first program polarity (e.g., NEG POL of FIG. 8) or a second program polarity (e.g., POS POL of FIG. 8), and wherein the first and second program polarities are opposite; applying, by digit line decoders, a voltage to respective digit lines for accessing a respective one of the first memory cells; selecting, by a controller, a program polarity to be the first program polarity or the second program polarity; and coupling, based on the selected program polarity, each digit line decoder to a respective first sensing circuit (e.g., NEG POL SA of FIG. 8) when the first program polarity (e.g., NEG) is selected, or to a respective second sensing circuit (e.g., POS POL SA of FIG. 8) when the second program polarity (e.g., POS) is selected.

In one embodiment, the first sensing circuit is configured to couple a first supply voltage (e.g., VDLPOS of FIG. 8) to the respective digit line decoder; the second sensing circuit is configured to couple a second supply voltage (e.g., VDLNEG of FIG. 8) to the respective digit line decoder; and the first and second supply voltages are of opposite polarity.

In one embodiment, the first sensing circuit is further configured to sense a current associated with the respective first memory cell, and limit the current (e.g., (hold); and the second sensing circuit is further configured to sense the current associated with the respective first memory cell, and limit the current (e.g., Ihold).

In one embodiment, each of the first memory cells snaps after being accessed during a read or write operation.

In one embodiment, a non-transitory computer-readable medium stores instructions which, when executed by a controller, cause the controller to: select a first access line for accessing a memory cell; select, using a decoder, a second access line for accessing the memory cell; select operation in a first program polarity (e.g., NEG polarity sense of FIG. 5) or a second program polarity (e.g., POS polarity sense of FIG. 5), wherein the first and second program polarities are opposite; and for operation in either of the selected first or second program polarity, sense a current through the decoder, and limit the current.

In one embodiment, the first access line is a wordline, the second access line is a digit line, and the decoder is a digit line decoder.

In one embodiment, a capacitance (e.g., 508 of FIG. 5) of the wordline is at least 100 times greater than a capacitance of the digit line (e.g., 516 of FIG. 5).

In one embodiment, respective structures of the first access line and the second access line are asymmetric.

In one embodiment, the memory cell is accessed as part of a programming operation in which more than one memory cell is programmed in parallel along the first access line (e.g., wordline/digit line); and sensing the current is part of a sense operation associated with the second access line (e.g., digit line/wordline), but not the first access line.

In one embodiment, the current is sensed by a selected first or second sensing circuit, coupled to the decoder, as part of a read or write operation.

In one embodiment, the read or write operation is performed in response to receiving a read or write command from a host device (e.g., 126 of FIG. 1).

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device comprising:
a digit line decoder configured to select a digit line for accessing a memory cell;
a controller configured to select operation in a first program polarity or a second program polarity, wherein the first and second program polarities are opposite; and
first circuitry coupled between a first voltage supply and the digit line decoder, the first circuitry configured to sense a characteristic associated with the memory cell, and limit a current through the memory cell when operating in the first program polarity.

2. The device of claim 1, further comprising second circuitry coupled between a second voltage supply and the digit line decoder, the second circuitry configured to sense the characteristic associated with the memory cell, and limit the current through the memory cell when operating in the second program polarity, wherein:
the first and second voltage supplies are of opposite polarity;
the characteristic is the current through the memory cell;
the first circuitry comprises a current limiter to limit the current, and a sense amplifier to sense the current; and
the second circuitry comprises a current limiter to limit the current, and a sense amplifier to sense the current.

3. The device of claim 2, wherein the current passes through the first circuitry when operating in the first program polarity, and the current passes through the second circuitry when operating in the second program polarity.

4. The device of claim 2, further comprising a wordline decoder configured to select a wordline for accessing the memory cell, wherein:
the first voltage supply has a first polarity;
the second voltage supply has a second polarity;
the wordline decoder is further configured to apply a voltage of the second polarity to the wordline when operating in the first program polarity; and
the wordline decoder is further configured to apply a voltage of the first polarity to the wordline when operating in the second program polarity.

5. The device of claim 4, wherein a capacitance of the wordline is at least 100 times greater than a capacitance of the digit line.

6. The device of claim 1, further comprising a wordline decoder configured to select a wordline for accessing the memory cell, wherein:
the digit line decoder is a first digit line decoder of a plurality of digit line decoders;
the memory cell is a first memory cell of a plurality of memory cells;
the wordline is further configured to simultaneously select the memory cells during a read operation; and
each of the memory cells is selected by a respective one of the digit line decoders during the read operation.

7. The device of claim 1, wherein the memory cell comprises chalcogenide.

8. The device of claim 1, wherein the memory cell snaps after being accessed during a read or write operation, and the current is limited by a current limiter after the memory cell snaps.

9. The device of claim 1, wherein the memory cell exhibits an S-shaped current-voltage (I-V) characteristic curve.

10. An apparatus comprising:
a memory array;
a wordline decoder configured to apply a voltage to a wordline for accessing first memory cells in the memory array, wherein the wordline decoder is further configured to operate in a first program polarity or a second program polarity, and wherein the first and second program polarities are opposite;
a plurality of digit line decoders, each digit line decoder configured to apply a voltage to a respective digit line for accessing a respective one of the first memory cells; and
a plurality of switches configured to couple each digit line decoder to a respective first sensing circuit when operating in the first program polarity, or to a respective second sensing circuit when operating in the second program polarity.

11. The apparatus of claim 10, wherein:
the first sensing circuit is configured to couple a first supply voltage to the respective digit line decoder;
the first sensing circuit is further configured to sense a current associated with the respective first memory cell, and limit the current;
the second sensing circuit is configured to couple a second supply voltage to the respective digit line decoder, wherein the first and second supply voltages are of opposite polarity; and
the second sensing circuit is further configured to sense the current associated with the respective first memory cell, and limit the current.

12. The apparatus of claim 10, wherein each of the first memory cells comprises chalcogenide.

13. The apparatus of claim 10, wherein each of the first memory cells snaps after being accessed during a read or write operation, and a current is limited for each respective memory cell after the memory cell snaps.

14. The apparatus of claim 10, wherein each of the first memory cells exhibits an S-shaped current-voltage (I-V) characteristic curve.

15. The apparatus of claim 10, wherein the first sensing circuit is configured to regulate the voltage applied to the respective digit line, and the second sensing circuit is configured to regulate the voltage applied to the respective digit line.

16. The apparatus of claim 10, wherein a current is sensed by the first or second sensing circuit as part of a read operation to determine a logic state of the respective first memory cell.

17. The apparatus of claim 16, wherein the read operation is performed by a controller in response to receiving a read command from a host device.

18. The apparatus of claim 11, wherein the current sensed by the first or second sensing circuit is a current through the respective first memory cell.

19. A method comprising:
applying, by digit line decoders, a voltage to respective digit lines for accessing a respective one of first memory cells;
selecting, by a controller, a program polarity to be a first program polarity or a second program polarity, wherein the first and second program polarities are opposite; and
coupling, based on the selected program polarity, each digit line decoder to a respective first sensing circuit when the first program polarity is selected, or to a respective second sensing circuit when the second program polarity is selected.

20. The method of claim 19, further comprising:
applying, by a wordline decoder, a voltage to a wordline for accessing the first memory cells, wherein the wordline decoder is configured to operate in the first program polarity or the second program polarity.

21. The method of claim 19, wherein:
the first sensing circuit is configured to couple a first supply voltage to the respective digit line decoder;
the second sensing circuit is configured to couple a second supply voltage to the respective digit line decoder; and
the first and second supply voltages are of opposite polarity.

22. The method of claim 21, wherein:
the first sensing circuit is further configured to sense a current associated with the respective first memory cell, and limit the current; and
the second sensing circuit is further configured to sense the current associated with the respective first memory cell, and limit the current.

23. The method of claim 19, wherein each of the first memory cells snaps after being accessed during a read or write operation.

24. A non-transitory computer-readable medium storing instructions which, when executed by a controller, cause the controller to:
select a first access line for accessing a memory cell;
select, using a decoder, a second access line for accessing the memory cell;
select operation in a first program polarity or a second program polarity, wherein the first and second program polarities are opposite; and
for operation in either of the selected first or second program polarity, sense a current through the decoder, and limit the current.

25. The non-transitory computer-readable medium of claim 24, wherein the first access line is a wordline, the second access line is a digit line, and the decoder is a digit line decoder.

26. The non-transitory computer-readable medium of claim 25, wherein a capacitance of the wordline is at least 100 times greater than a capacitance of the digit line.

27. The non-transitory computer-readable medium of claim 24, wherein respective structures of the first access line and the second access line are asymmetric.

28. The non-transitory computer-readable medium of claim 27, wherein:
   the memory cell is accessed as part of a programming operation in which more than one memory cell is programmed in parallel along the first access line; and
   sensing the current is part of a sense operation associated with the second access line, but not the first access line.

29. The non-transitory computer-readable medium of claim 24, wherein the current is sensed by a selected first or second sensing circuit, coupled to the decoder, as part of a read or write operation.

30. The non-transitory computer-readable medium of claim 29, wherein the read or write operation is performed in response to receiving a read or write command from a host device.

* * * * *